(12) United States Patent
Kwag

(10) Patent No.: US 12,514,012 B2
(45) Date of Patent: Dec. 30, 2025

(54) IMAGE SENSING DEVICE AND METHOD FOR MANUFACTURING THE SAME

(71) Applicant: SK hynix Inc., Icheon-si (KR)

(72) Inventor: Pyong Su Kwag, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 476 days.

(21) Appl. No.: 18/069,795

(22) Filed: Dec. 21, 2022

(65) Prior Publication Data
US 2024/0079426 A1    Mar. 7, 2024

(30) Foreign Application Priority Data
Sep. 6, 2022   (KR) .................. 10-2022-0112947

(51) Int. Cl.
*H10F 39/00*   (2025.01)
(52) U.S. Cl.
CPC ......... *H10F 39/805* (2025.01); *H10F 39/018* (2025.01); *H10F 39/024* (2025.01); *H10F 39/809* (2025.01); *H10F 39/811* (2025.01)

(58) Field of Classification Search
CPC ............... H10F 39/199; H10F 39/8053; H10F 39/8063; H10F 39/807; H10F 39/018; H10F 39/024; H10F 39/011; H10F 39/014
See application file for complete search history.

(56) References Cited

U.S. PATENT DOCUMENTS

2013/0069189 A1   3/2013   Kao
2019/0131336 A1*  5/2019   Yoon ..................... H10F 39/809

* cited by examiner

*Primary Examiner* — Ali Naraghi
*Assistant Examiner* — Samuel Jonathan Smith
(74) *Attorney, Agent, or Firm* — Perkins Coie LLP

(57) ABSTRACT

An image sensing device includes a first substrate including a first surface and a second surface facing away from the first surface, the first substrate including a pixel region and a pad region located outside the pixel region, the pixel region being structured to include pixel that generate electrical signals based on light incident upon the first surface to reach to the pixels, an insulation layer disposed under the second surface and including interconnects and an electrode pad, a pad open region disposed in the pad region and structured to expose the electrode pad, and a substrate isolation layer disposed outside the pixel region in the first substrate and formed to penetrate the first substrate. The substrate isolation layer includes a lens material.

10 Claims, 14 Drawing Sheets

IMAGE SENSING DEVICE AND METHOD FOR MANUFACTURING THE SAME

PRIORITY CLAIM AND CROSS-REFERENCE TO RELATED APPLICATION

This patent document claims the priority and benefits of Korean patent application No. 10-2022-0112947, filed on Sep. 6, 2022, which is incorporated by reference in its entirety as part of the disclosure of this patent document.

TECHNICAL FIELD

The technology and implementations disclosed in this patent document generally relate to an image sensing device and a method for manufacturing the same.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

Multi-layer image sensors are used to meet the demands for high-resolution, high-speed image sensors. The multi-layer image sensors include upper layers stacked on lower layers and through silicon via (TSV) structures that include an electrically conductive material to electrically connect circuits of the upper and lower layers to each other.

SUMMARY

Various embodiments of the disclosed technology relate to an image sensing device having a new substrate isolation structure.

Various embodiments of the disclosed technology relate to a new fabrication process for forming a substrate isolation structure and a direct pad.

In some embodiments of the disclosed technology, an image sensing device may include a first substrate including a first surface and a second surface facing away from the first surface, the first substrate including a pixel region and a pad region located outside the pixel region, the pixel region being structured to include pixel that generate electrical signals based on light incident upon the first surface to reach to the pixels, an insulation layer disposed under the second surface and including interconnects and an electrode pad, a pad open region disposed in the pad region and structured to expose the electrode pad, and a substrate isolation layer disposed outside the pixel region in the first substrate and formed to penetrate the first substrate. The substrate isolation layer includes a lens material.

In some embodiments of the disclosed technology, a method for manufacturing an image sensing device may include bonding a first stacked structure including a first substrate and a first insulation layer to a second stacked structure including a second substrate and a second insulation layer such that the first insulation layer and the second insulation layer are in contact with each other; forming a pad hole in a pad region predefined and a substrate isolation layer trench in a peripheral region of the pad region by etching the first substrate; forming a lens material layer over the first substrate such that a lens material is formed at a sidewall of the pad hole while filling the substrate isolation layer trench; and exposing an electrode pad disposed in the second insulation layer by etching the first insulation layer and the second insulation layer using the lens material layer formed at the sidewall of the pad hole as an etching mask.

In some embodiments of the disclosed technology, an image sensing device may include an image sensing device may include a first substrate including a first surface upon which light is incident and a second surface facing or opposite to the first surface and including a pixel region and a pad region located outside the pixel region, an insulation layer disposed under the second surface and including interconnects and an electrode pad, a pad open region disposed in the pad region and formed to expose the electrode pad, and a substrate isolation layer disposed outside the pixel region in the first substrate and formed to penetrate the first substrate. The substrate isolation layer includes a lens material.

In some embodiments of the disclosed technology, a method for manufacturing an image sensing device may include bonding a first stacked structure including a first substrate and a first insulation layer and a second stacked structure including a second substrate and a second insulation layer to each other such that the first insulation layer and the second insulation layer are in contact with each other; forming a pad hole in a pad region predefined by etching the first substrate, and forming a substrate isolation layer trench in a peripheral region of the pad region; forming a lens material layer over the first substrate such that a lens material is formed at a sidewall of the pad hole while filling the substrate isolation layer trench; and exposing an electrode pad disposed in the second insulation layer by etching the first insulation layer and the second insulation layer using the lens material layer formed at the sidewall of the pad hole as an etching mask.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and a method for forming the same that may be used to substantially address one or more technical or engineering issues and mitigate limitations or disadvantages encountered in some other image sensing devices. Some implementations of the disclosed technology suggest examples of an image sensing device having a new substrate isolation structure, and examples of a new fabrication process for forming a substrate isolation structure and a direct pad. The disclosed technology provides various implementations of an image sensing device which can increase production efficiency by reducing the number of masks and the number of fabrication processes that are required to form a trench isolation structure and a direct pad.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
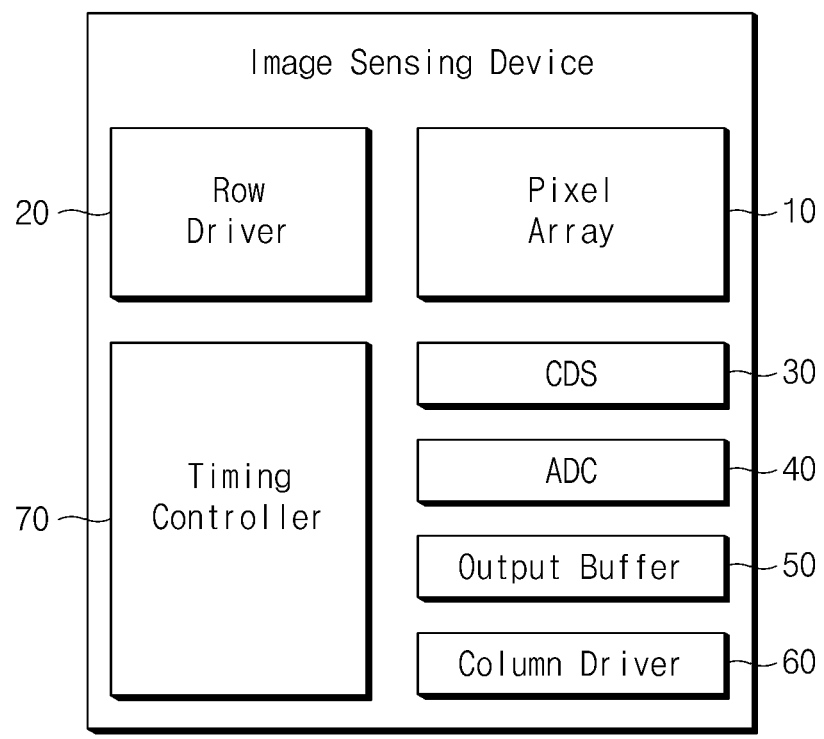
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 10, a row driver 20, a correlated double sampler (CDS) 30, an analog-digital converter (ADC) 40, an output buffer 50, a column driver 60 and a timing controller 70. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light, and a phase detection pixel that is structured to generate second electrical signals for calculating a phase difference between the images.

The pixel array 10 may include a plurality of unit pixels arranged in rows and columns. In one example, the plurality of unit pixels can be arranged in a two dimensional (2D) pixel array including rows and columns. In another example, the plurality of unit pixels can be arranged in a three dimensional (3D) pixel array. The plurality of unit pixels may convert an optical signal into an electrical signal on a unit pixel basis or a pixel group basis, where unit pixels in a pixel group share at least certain internal circuitry. The plurality of unit pixels may include a plurality of imaging pixels and a plurality of phase detection pixels. Each of the image pixels may generate an image signal acting as an electrical signal corresponding to a target object to be captured.

The pixel array 10 may receive driving signals (for example, a row selection signal, a reset signal, a transmission (or transfer) signal, etc.) from the row driver 20. Upon receiving the driving signal, the unit pixels may be activated to perform the operations corresponding to the row selection signal, the reset signal, and the transfer signal.

The row driver 20 may activate the pixel array 10 to perform certain operations on the unit pixels in the corresponding row based on control signals provided by controller circuitry such as the timing controller 70. In some implementations, the row driver 20 may select one or more pixel groups arranged in one or more rows of the pixel array 10. The row driver 20 may generate a row selection signal to select one or more rows from among the plurality of rows. The row driver 20 may sequentially enable the reset signal and the transfer signal for the unit pixels arranged in the selected row. The pixel signals generated by the unit pixels arranged in the selected row may be output to the correlated double sampler (CDS) 30.

The correlated double sampler (CDS) 30 may remove undesired offset values of the unit pixels using correlated double sampling. In one example, the correlated double sampler (CDS) 30 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 30 may obtain a pixel signal generated only by the incident light without causing noise. In some implementations, upon receiving a clock signal from the timing controller 70, the CDS 30 may sequentially sample and hold voltage levels of the reference signal and the pixel signal, which are provided to each of a plurality of column lines from the pixel array 10. That is, the CDS 30 may sample and hold the voltage levels of the reference signal and the pixel signal which correspond to each of the columns of the pixel array 10. In some implementations, the CDS 30 may transfer the reference signal and the pixel signal of each of the columns as a correlate double sampling (CDS) signal to the ADC 40 based on control signals from the timing controller 70.

The ADC 40 is used to convert analog CDS signals received from the CDS 30 into digital signals. In some implementations, the ADC 40 may be implemented as a ramp-compare type ADC. The analog-to-digital converter (ADC) 40 may compare a ramp signal received from the timing controller 70 with the CDS signal received from the CDS 30, and may thus output a comparison signal indicating the result of comparison between the ramp signal and the CDS signal. The analog-to-digital converter (ADC) 40 may count a level transition time of the comparison signal in response to the ramp signal received from the timing generator 70, and may output a count value indicating the counted level transition time to the output buffer 50.

The output buffer 50 may temporarily store column-based image data provided from the ADC 40 based on control signals of the timing controller 70. The image data received from the ADC 40 may be temporarily stored in the output buffer 50 based on control signals of the timing controller 70. The output buffer 50 may provide an interface to compensate for data rate differences or transmission rate differences between the image sensing device and other devices.

The column driver 60 may select a column of the output buffer 50 upon receiving a control signal from the timing controller 70, and sequentially output the image data, which are temporarily stored in the selected column of the output buffer 50. In some implementations, upon receiving an address signal from the timing controller 70, the column driver 60 may generate a column selection signal based on the address signal, may select a column of the output buffer 50 using the column selection signal, and may control the image data received from the selected column of the output buffer 50 to be output as an output signal.

The timing controller 70 may generate signals for controlling operations of the row driver 20, the ADC 40, the output buffer 50 and the column driver 60. The timing controller 70 may provide the row driver 20, the column driver 60, the ADC 40, and the output buffer 50 with a clock signal required for the operations of the respective components of the image sensing device, a control signal for timing control, and address signals for selecting a row or column. In some implementations, the timing controller 70 may include a logic control circuit, a phase lock loop (PLL) circuit, a timing control circuit, a communication interface circuit and others.

Figure 2:
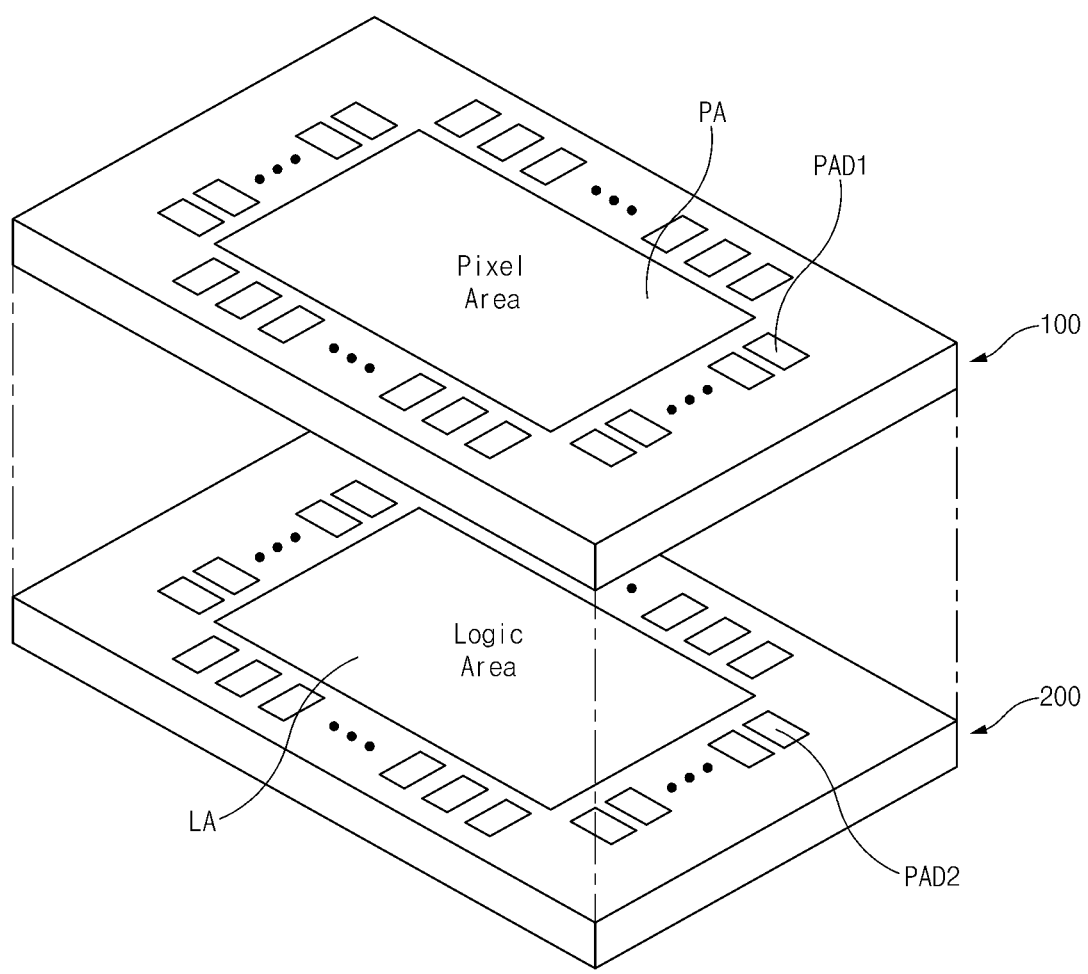
FIG. 2 is a perspective view schematically illustrating an example structure of an image sensing device based on some implementations of the disclosed technology.
Figure 3:
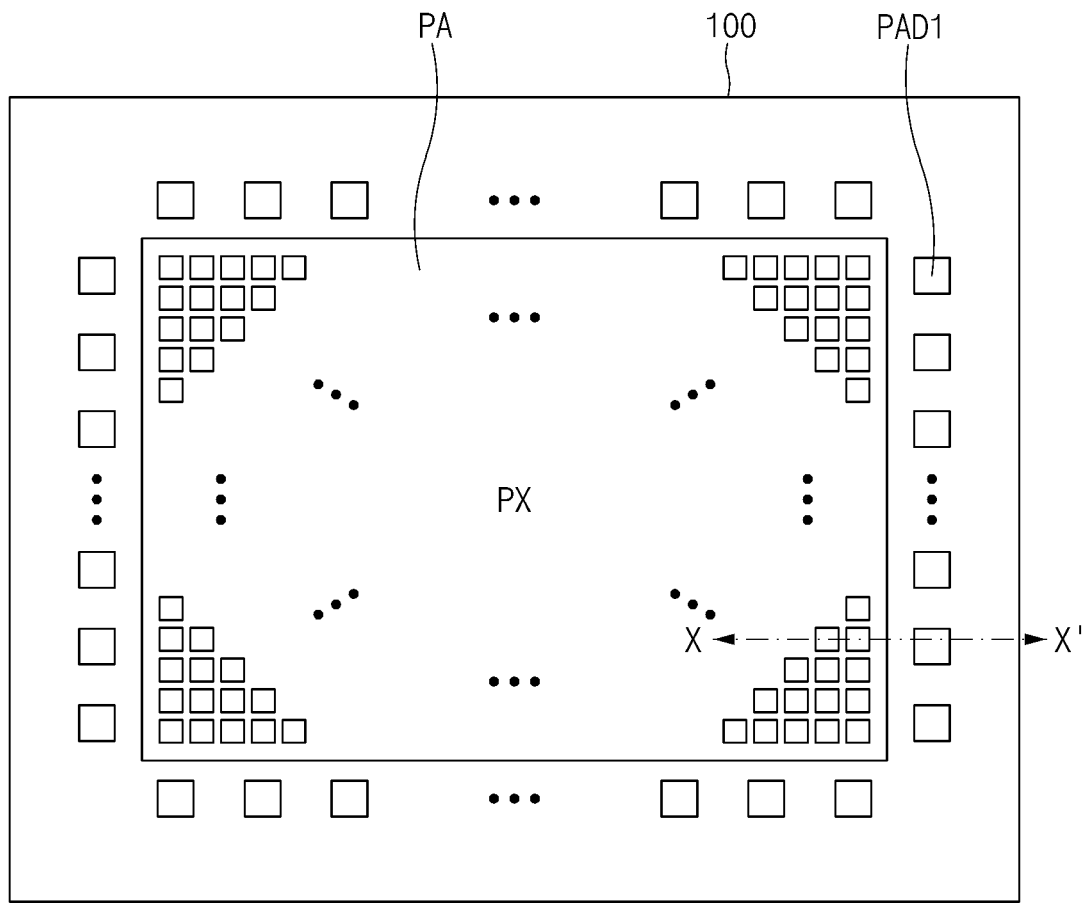
FIG. 3 is a plan view illustrating an example of a first stacked structure arranged in the image sensing device shown in FIG. 2 based on some implementations of the disclosed technology.

FIG. 2 is a perspective view schematically illustrating an example structure of an image sensing device based on some implementations of the disclosed technology. FIG. 3 is a plan view illustrating an example of a first stacked structure arranged in the image sensing device shown in FIG. 2 based on some implementations of the disclosed technology.

Referring to FIGS. 2 and 3, the image sensing device may include a first stacked structure 100 and a second stacked structure 200.

The first stacked structure 100 may be disposed over the second stacked structure 200. The first stacked structure 100 may include a pixel region (PA) in which the pixel array 10 shown in FIG. 1 is formed, and a first pad region (PAD1) located outside the pixel region (PA).

The pixel region (PA) may be disposed at a center portion of the first stacked structure 100. The pixel region (PA) may include a plurality of unit pixels (PXs) arranged in rows and columns. Each unit pixel (PX) may include a photoelectric conversion region, a color filter, a microlens, and a plurality of pixel transistors.

The first stacked structure 100 may include a first substrate, and a first interconnect layer formed below a surface (e.g., a first front surface) facing the second stacked structure 200 on the first substrate. The first interconnect layer may include an interlayer insulation layer and metal interconnects disposed in the interlayer insulation layer. The metal interconnects of the first stacked structure may be electrically connected to pixel transistors of the unit pixels (PXs). In the first substrate, color filters and microlenses of the unit pixels (PXs) may be formed over a first back surface opposite to the first front surface of the first substrate.

Substrate isolation layers may be formed outside the pixel region (PA) in the first stacked structure 100 to protect or isolate the pixel region (PA) and the first pad region (PAD1) from other material layers. In some implementations, the substrate isolation layers may be formed to penetrate the first substrate. In some implementations, the substrate isolation layers may include a lens material.

The second stacked structure 200 may include a logic region (LA) in which the row driver 20, the CDS 30, the ADC 40, the output buffer 50, the column driver 60, and the timing controller 70 shown in FIG. 1 are formed, and a second pad region (PAD2) located outside the logic region (LA).

The logic region (LA) may be disposed at a center portion of the second stacked structure 200. The logic region (LA) may include electronic circuitry (e.g., transistors) that can generate control signals to control operations of the unit pixels (PXs) and generate images by processing pixel signals output from the unit pixels (PXs). The second pad region (PAD2) may refer to a region formed to vertically overlap with the first pad region (PAD1) in the second stacked structure 200.

The second stacked structure 200 may include a second substrate, and a second interconnect layer formed over a surface of the second stacked structure 200 (e.g., a second front surface) facing the first stacked structure 100 on the second substrate. The first stacked structure 100 and the second stacked structure 200 may be stacked so that the first interconnect layer and the second interconnect layer are in contact with each other. The second interconnect layer may include an interlayer insulation layer and a plurality of metal interconnects formed in the interlayer insulation layer. The metal interconnects of the second stacked structure 200 may include metal interconnects connected to the logic circuit, and an electrode pad directly connected to a bonding wire.

The pad regions PAD1 and PAD2 may include an electrode pad and a pad open region allowing the electrode pad to be connected to the bonding wire. For example, the electrode pad may be located at the pad region PAD2 in the second interconnect layer, and may be exposed outside by the pad open region. The pad open region may include a portion of the second interconnect layer that is etched so that, in the first pad region PAD1, the first substrate and the first interconnect layer are penetrated and, in the second pad region PAD2, the electrode pad is exposed. For example, the pad open region may include a first pad hole penetrating the first substrate, a second pad hole penetrating the first interconnect layer, and a pad trench formed by etching a portion of the second interconnect layer. The detailed structure of this pad open region will be described later.

In some implementations, the electrode pad is not connected to the metal interconnect in the second stacked structure 200 through a through silicon via (TSV) structure, and may have a direct pad structure that is formed by directly connecting the bonding wire to the metal interconnect in the second stacked structure 200.

Figure 4:
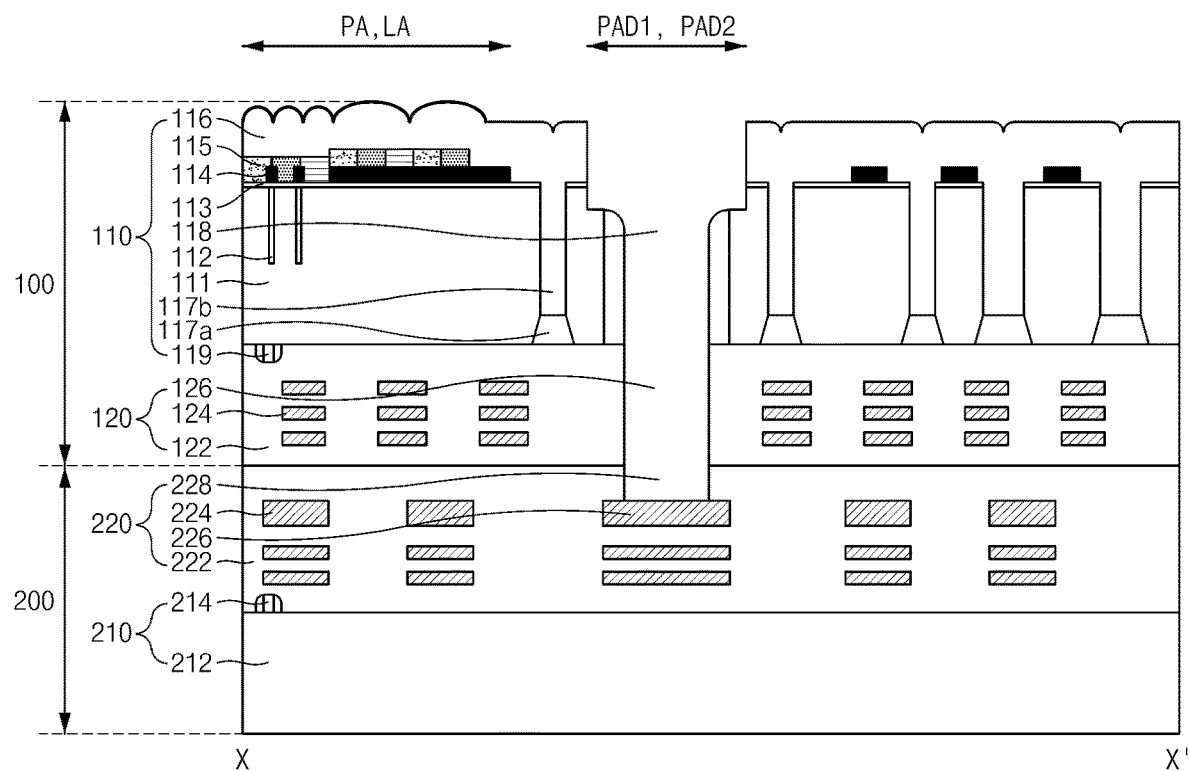
FIG. 4 is a cross-sectional view illustrating an example of the first stacked structure taken along the line X-X' shown in FIG. 3 based on some implementations of the disclosed technology.

FIG. 4 is a cross-sectional view illustrating an example of the first stacked structure 100 taken along the line X-X' shown in FIG. 3 based on some implementations of the disclosed technology.

Referring to FIG. 4, the first stacked structure 100 may include a first substrate layer 110 and a first interconnect layer 120.

The first substrate layer 110 may include a first substrate 111, a pixel isolation layer 112, a planarization layer 113, a light blocking structure 114, color filters 115, a lens layer 116, substrate isolation layers 117a and 117b, a first pad hole 118, and pixel transistors 119.

The first substrate 111 may include a pixel region (PA) and a first pad region (PAD1) that is located outside the pixel region (PA). The first substrate 111 may include a first front surface and a first back surface opposite to, or facing away from, the first front surface. The first back surface of the first substrate 111 may be a light reception surface upon which light is incident, and may be formed to have the color filters 115 and the lens layer 116 of the unit pixels (PXs). The first front surface of the first substrate 111 may be formed to have pixel transistors 119, and may be in contact with the first interconnect layer 120. In some implementations, the image sensing device may include a backside illuminated (BSI) image sensing device.

The first substrate 111 may include a semiconductor substrate. In some implementations, the first substrate 111 may include a bulk-silicon substrate or a silicon-on-insulator (SOI) substrate. In some implementations, the first substrate 111 may include an epitaxial layer formed over a base substrate.

The pixel isolation layer 112 may isolate each of photoelectric conversion elements of adjacent unit pixels (PX) in the first substrate 111. The pixel isolation layer 112 may include a trench isolation structure that includes an insulation material formed in a trench that is formed by etching the first substrate 111 to a predetermined depth. For example, the pixel isolation layer 112 may have a deep trench isolation (DTI) structure.

The planarization layer 113 may be formed over the first back surface of the first substrate 111. The planarization layer 113 may cover the first back surface of the first substrate 111. The planarization layer 113 may include an insulation material such as silicon oxide.

The light blocking structure 114 may include a grid structure disposed between the color filters of effective pixels to prevent crosstalk between adjacent color filters, and a light shielding layer to block light from being incident upon the first substrate 111. The light blocking structure 114 may include a metal material such as tungsten (W). The light blocking structure 114 may be formed over the planarization layer 113.

The color filters 115 may be formed over the first back surface in the pixel region (PA). In some implementations, each of the unit pixels includes one of the color filters 115 to filter incident light to allow only certain wavelengths (e.g., visible light) to pass through. The color filters 115 may include red color filters, green color filters, or blue color filters (R, G, B) arranged in a certain pattern such as a Bayer pattern. The color filters 115 may be formed over the planarization layer 113 in an effective pixel region, and may be formed over the light shielding layer in an optical black pixel (OBP) region. The color filters 115 may include a photoresist dyed with a dye.

The lens layer 116 may converge incident light onto the photoelectric conversion region of the unit pixel. The lens layer 116 may include an over-coating layer and a plurality of microlenses. The over-coating layer may be formed over the color filter 115 to remove a step difference between the color filters 115. The microlenses may be formed over the over-coating layer, and each of the microlenses may be formed in a convex hemispherical shape having a predetermined radius of curvature (RoC). A lens capping layer may be formed over the lens layer 116 to protect the lens layer 116 and to prevent lens flare from occurring in the lens layer 116. The lens layer 116 may include a light transmissive photoresist.

The lens layer 116 may be formed to extend to an outer region of the pixel region (PA).

For example, the lens material (e.g., light transmissive photoresist) of the lens layer 116 may entirely cover the outer region of the pixel region (PA) and may extend to the outer region of the pixel region (PA) so as to be used as a substrate isolation layer 117b.

The substrate isolation layers 117a and 117b may be located outside the pixel region (PA) in the first substrate 111 so as to isolate the pixel region (PA) and the first pad region (PAD1) from each other. For example, the substrate isolation layers 117a and 117b may be formed to surround the first pad region (PAD1) in the first substrate 111. In addition, the substrate isolation layers 117a and 117b may be located outside the first pad region (PAD1) to prevent cracks from propagating to the pixel region (PA) and the first pad region (PAD1).

The substrate isolation layers 117a and 117b may include a first substrate isolation layer 117a and a second substrate isolation layer 117b that are vertically stacked on top of one another.

The first substrate isolation layer 117a may include a shallow trench isolation (STI) structure that includes an insulation material formed in a first trench that is formed by etching the first substrate 111 to a predetermined depth toward the first front surface of the first substrate 111. In this case, the insulation material formed in the first trench may include an oxide layer. The second substrate isolation layer 117b may include a deep trench isolation (DTI) structure that includes an insulation material formed in a second trench that is formed by etching the first substrate 111 from the first back surface of the first substrate 111 to the first substrate isolation layer 117a. In this case, the insulation material formed in the second trench may include a lens material. The lens material may include a material (e.g., light transmissive photoresist) that constitutes the lens layer 116 formed in the pixel region (PA). The lens material of the second trench may be formed simultaneously with formation of the over-coating layer in the lens layer 116.

The first pad hole 118 may be disposed in the first pad region PAD1 of the first substrate 111 to allow the first substrate 111 to pass therethrough. The first pad hole 118 may be a portion of the pad open region. In some implementations, the interconnect (electrode pad) 226 disposed in the second stacked structure 200 can be directly connected to the bonding wire through at least a portion of the first pad hole 118.

The lens material may be deposited over a sidewall of the first pad hole 118. The lens material layer formed over the sidewall of the first pad hole 118 may be used as an etch mask for forming the second pad hole 126. In addition, the lens material layer formed over the sidewall of the first pad hole 118 may be formed to surround the first pad hole 118, thereby serving as a substrate isolation layer capable of protecting the first pad hole 118.

Pixel transistors 119 may be formed over the first front surface of the first substrate 111 so that the pixel transistors 119 are electrically coupled to the first interconnects 124 of the first interconnect layer 120. The pixel transistors 119 may be formed to correspond to the unit pixels (PXs) in the pixel region (PA). The pixel transistors 119 may generate pixel signals corresponding to the amount of photocharges generated by the photoelectric conversion element of the corresponding unit pixel (PX), and may output the pixel signals through the first interconnects 124. In some implementations, the pixel transistors 119 may include at least one of a transfer transistor, a reset transistor, a source follower transistor, or a select transistor.

The first interconnect layer 120 may be formed under the first front surface of the first substrate 111 while being in contact with the first surface of the first substrate 111. The first interconnect layer 120 may be in contact with a second interconnect layer 220 of the second stacked structure 200. The first interconnect layer 120 may include a first interlayer insulation layer 122, first interconnects 124, and a second pad hole 126.

The first interlayer insulation layer 122 may include an insulation material formed between the pixel transistors 119 and the first interconnects 124. For example, the first interlayer insulation layer 122 may include at least one of silicon oxide, silicon nitride, or silicon oxynitride.

The first interconnects 124 may be formed in the first interlayer insulation layer 122, and may be electrically connected to the pixel transistors 117 so as to transmit the pixel signals to the logic circuit of the second stacked structure 200. In addition, the first interconnects 124 may electrically connect the pixel transistors 119 within the pixel region (PA) to each other and/or another circuit. The first interconnects 124 may be formed in a multilayer structure.

The second pad hole 126 may be disposed in the first interlayer insulation layer 122 within the first pad region (PAD1), and may be formed to allow the first interlayer insulation layer 122 to pass therethrough. The second pad hole 126 may be a portion of the pad open region, and may vertically overlap the first pad hole 118. In some implementations, the second pad hole 126 and the first pad hole 118 may be used as a path for the bonding wire to pass through.

The second stacked structure 200 may include a second substrate layer 210 and a second interconnect layer 220.

The second substrate layer 210 may include a second substrate 212 and a plurality of logic transistors 214.

The second substrate 212 may include a logic region (LA) and a second pad region (PAD2) located outside the logic region (LA). The second substrate 212 may include a second front surface and a second back surface opposite to, or facing away from, the second front surface. The second front surface of the second substrate 212 may be a surface on which the logic transistors 214 are formed, and may be in contact with the second interconnect layer 220. The second substrate 212 may include a semiconductor substrate such as a first substrate 111.

The logic transistors 214 may be formed over a second front surface of the second substrate 212 such that the logic transistors 214 can be coupled to the second interconnects 224. The logic transistors 214 may generate control signals to control operations of the unit pixels (PXs), and may process the pixel signals output from the unit pixels (PXs) to generate an image corresponding to the pixel signals. For example, the logic transistors 214 may include transistors that can constitute the row driver 20, the CDS 30, the ADC 40, the output buffer 50, the column driver 60, and the timing controller 70 shown in FIG. 1. The logic transistors 214 may be formed in the logic region (LA) within the second substrate 212. The logic transistors 214 may be electrically coupled to the external device through the electrode pad 226.

The second interconnect layer 220 may be formed over the second front surface of the second substrate 212, may be formed to contact the second front surface of the second substrate 212, and may be in contact with the first interconnect layer 120 of the first stacked structure 100. The second interconnect layer 220 may include a second interlayer insulation layer 222, second interconnects 224, an electrode pad 226, and a pad trench 228.

The second interlayer insulation layer 122 may include an insulation material formed between the logic transistors 214 and the second interconnects 224. For example, the second interlayer insulation layer 222 may include at least one of silicon oxide, silicon nitride, or silicon oxynitride.

The second interconnects 224 may be formed in the second interlayer insulation layer 222, and may electrically connect the logic transistors 214 to the first interconnects or the electrode pad 226. In addition, the second interconnects 224 may electrically connect the logic transistors 214 to each other within the logic region (LA). The second interconnects 224 may be formed in a multilayer structure. The second interconnect formed in the uppermost layer from among the second interconnects 224 may be thicker than other interconnects.

The electrode pad 226 may be disposed in the second interlayer insulation layer 222 within the second pad region PAD2, and a top surface of the electrode 226 may be exposed by the pad holes 118 and 126 and the pad trench 228. The exposed top surface of the electrode pad 226 may be directly connected to the bonding wire through the pad holes 118 and 126 and the pad trench 228. The electrode pad 226 and the uppermost second interconnects may be formed simultaneously. For example, the interconnects disposed in the second pad region (PAD2) from among the second interconnects 224 of the uppermost layer may be used as the electrode pad 226.

The pad trench 228 may be located in the second interlayer isolation layer 222 within the second pad region (PAD2), and may be formed by partially etching the second interlayer isolation layer 222. The pad trench 228, which is a portion of the pad open region, may vertically overlap the first pad hole 118 and the second pad hole 126. In some implementations, the pad trench 228, the first pad hole 118 and the second pad hole 126 may be used as a path for the bonding wire to pass through.

FIGS. 5 to 12 are cross-sectional views illustrating examples of a method for forming the TSV structure shown in FIG. 4 based on some implementations of the disclosed technology.

Figure 5:
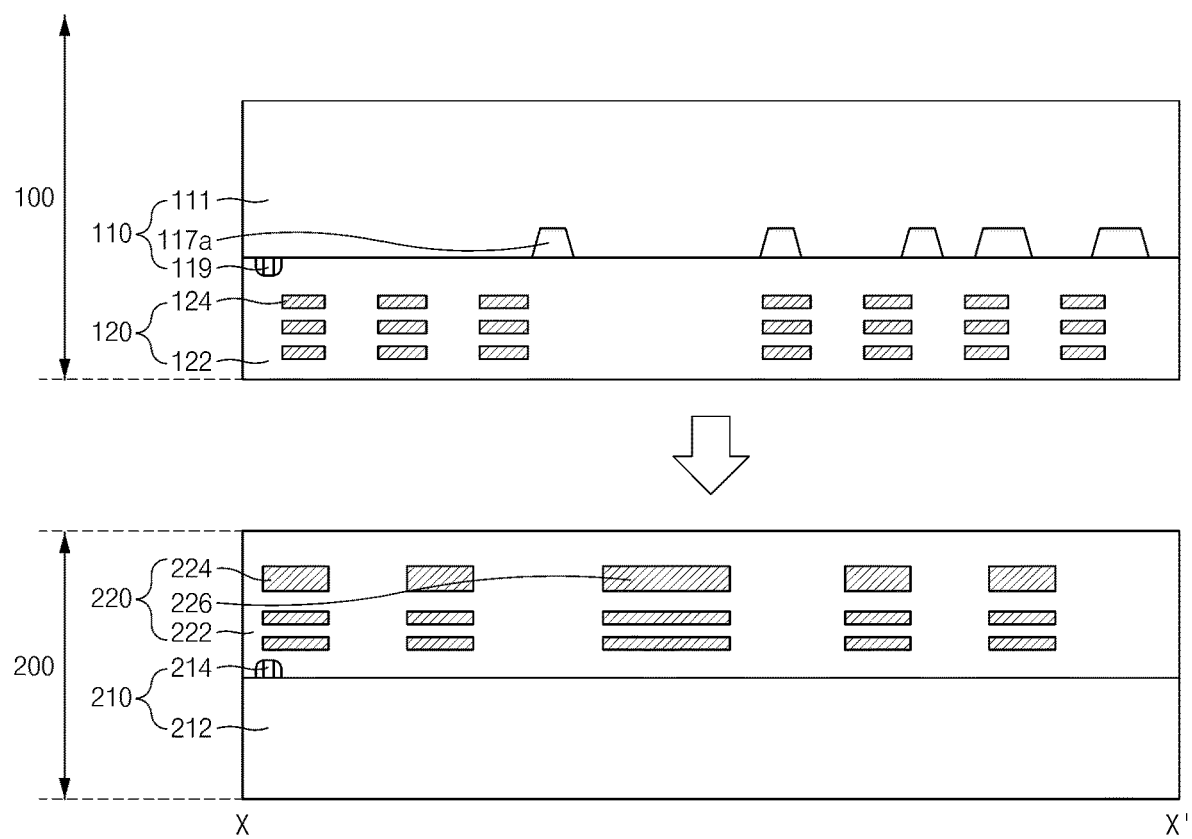
FIGS. 5 to 12 are cross-sectional views illustrating an example method for forming the structure shown in FIG. 4 based on some implementations of the disclosed technology.

Referring to FIG. 5, pixel transistors 119 and first substrate isolation layers 117a may be formed at the first front surface of the first substrate 111. Each of the first substrate isolation layers 117a may have a shallow trench isolation (STI) structure. In some implementations, each of the first substrate isolation layers 117a the device isolation layer capable of isolating the pixel transistors 119 from each other may be formed simultaneously.

Subsequently, the first interconnect layer 120 including the first interlayer insulation layer 122 and the first interconnects 124 may be formed over the first front surface.

In addition, after the logic transistors 214 are formed over the second front surface of the second substrate 212, the second interconnect layer 220, which includes the second interlayer insulation layer 222, the second interconnects 224 and the electrode pad 226, may be formed over the second front surface.

Subsequently, the first stacked structure 100 may be attached to the second stacked structure 200 so that the first interconnect layer 120 and the second interconnect layer 220 are in contact with each other.

Figure 6:
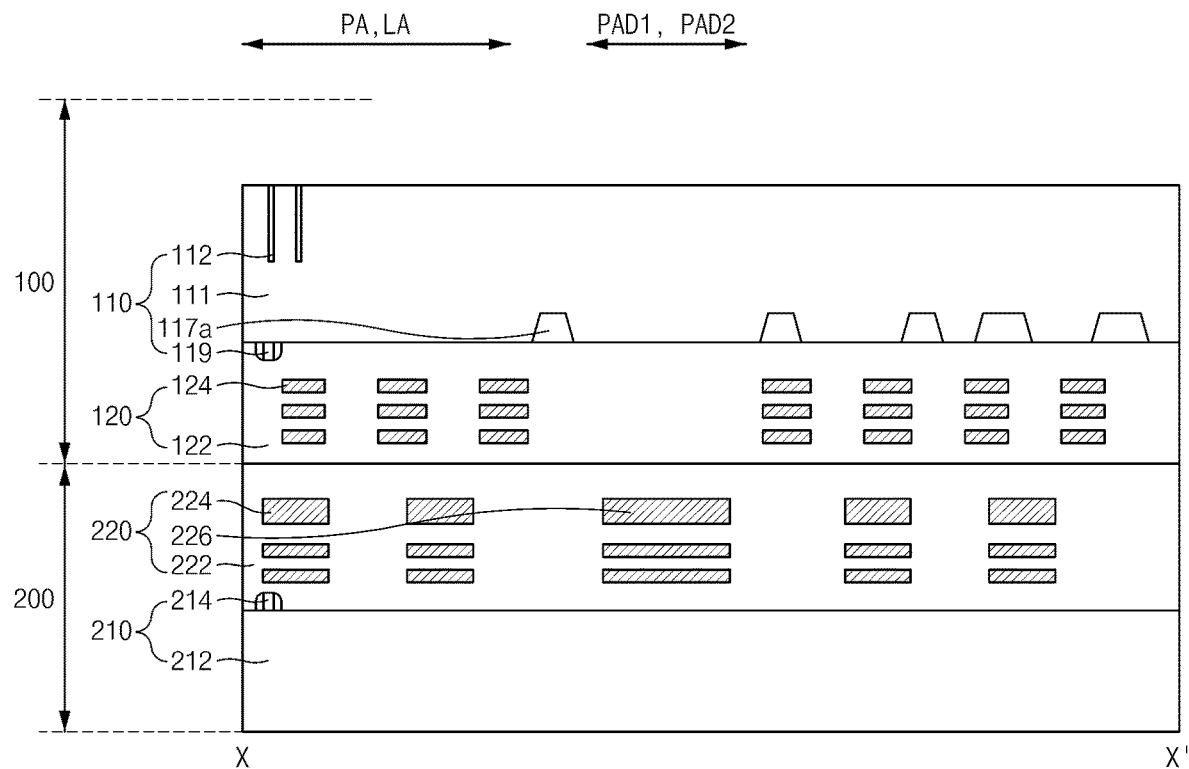

Referring to FIG. 6, after a trench is formed by etching the first back surface of the first substrate 111, the trench may be filled with an insulation material, forming the pixel isolation layers 112. Thereafter, photoelectric conversion regions (not shown) may be formed in a region defined by the pixel isolation layers 112 in the first substrate 111.

Figure 7:
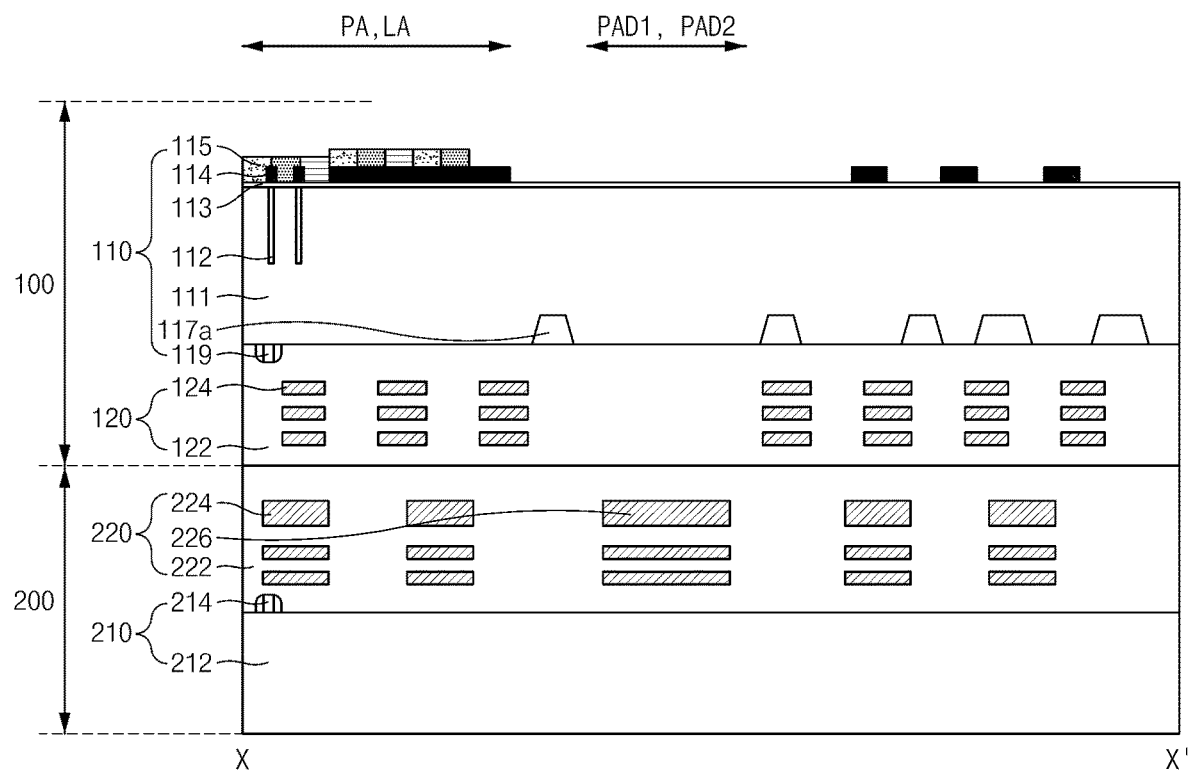

Referring to FIG. 7, a planarization layer 113 may be formed entirely on the first back surface of the first substrate 111.

Subsequently, after the light blocking structure 114 is formed over the planarization layer 113, color filters 115 may be formed in the pixel region (PA). The light blocking structure 114 may include a grid structure that can reduce/minimize crosstalk between adjacent color filters in the effective pixel area, and a light shielding layer that can block light from being incident upon the first substrate 111 in the optical black pixel (OBP) region.

The planarization layer 113, the light blocking structure 114, and the color filters 115 may be formed in the same manner as in the related art.

Figure 8:
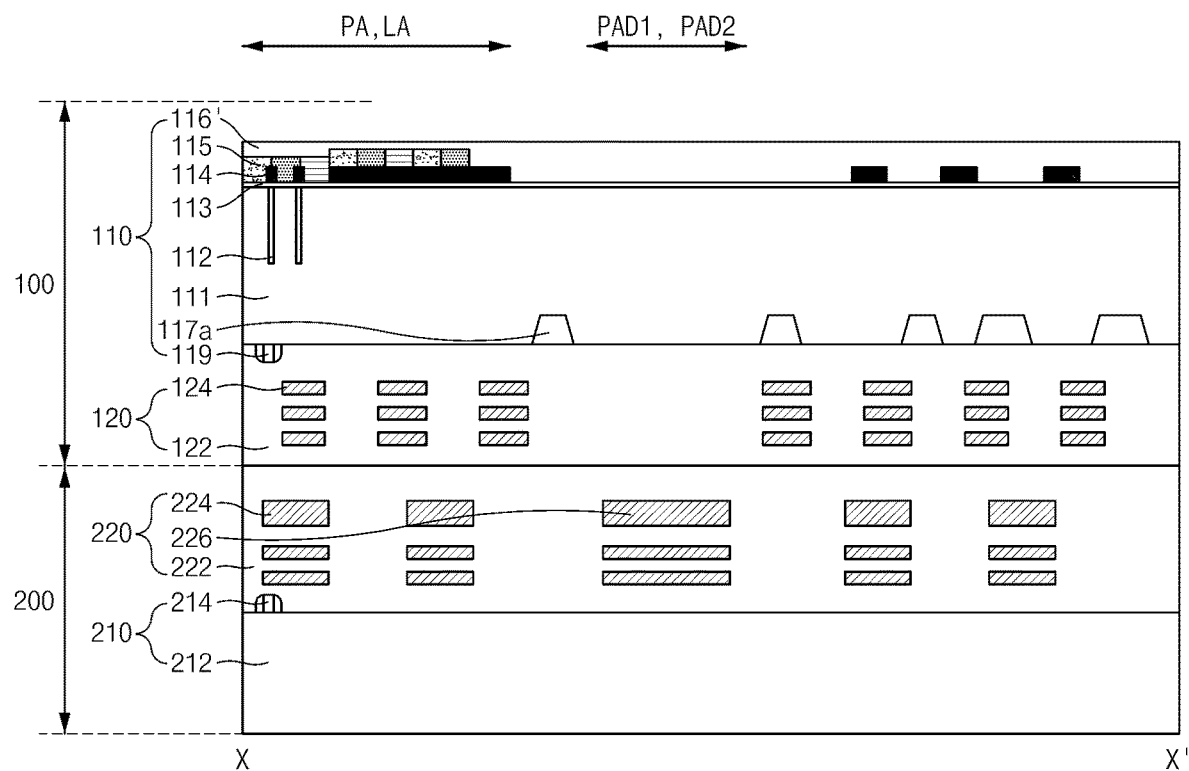

Referring to FIG. 8, the lens material layer may be deposited on the entire first back surface of the first substrate 111 to cover the planarization layer 113, the light blocking structure 114, and the color filters 115, forming a lens material layer 116'. In this case, the lens material layer 116' may include a light transmissive photoresist.

Figure 9:
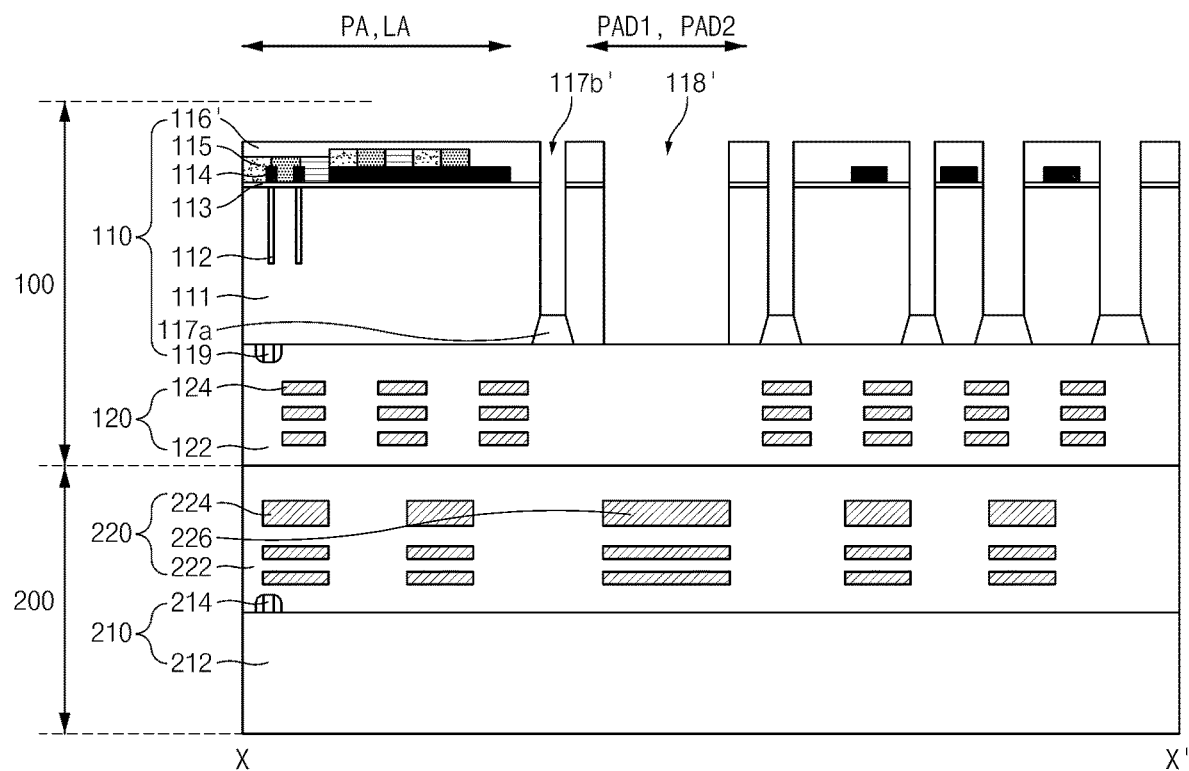

Referring to FIG. 9, the first substrate 111, the planarization layer 113, and the lens material layer 116' may be etched in a region where the second substrate isolation layer 117b is to be formed, so that the substrate isolation layer trenches 117b' exposing the first substrate isolation layer 117a can be formed. In addition, the first substrate 111, the planarization layer 113, and the lens material layer 116' of the pad region (PAD1) may be etched to form a first pad hole 118' penetrating the first substrate 111.

As described above, in some implementations, a substrate isolation layer trench 117b', in which the substrate isolation layer 117b is to be formed in the first substrate 111, and the first pad hole 118' exposing the electrode pad 224 may be simultaneously formed through the same etching process using the same etching mask. Accordingly, the number of etching masks can be reduced, and the number of fabrication processes can also be reduced.

Figure 10:
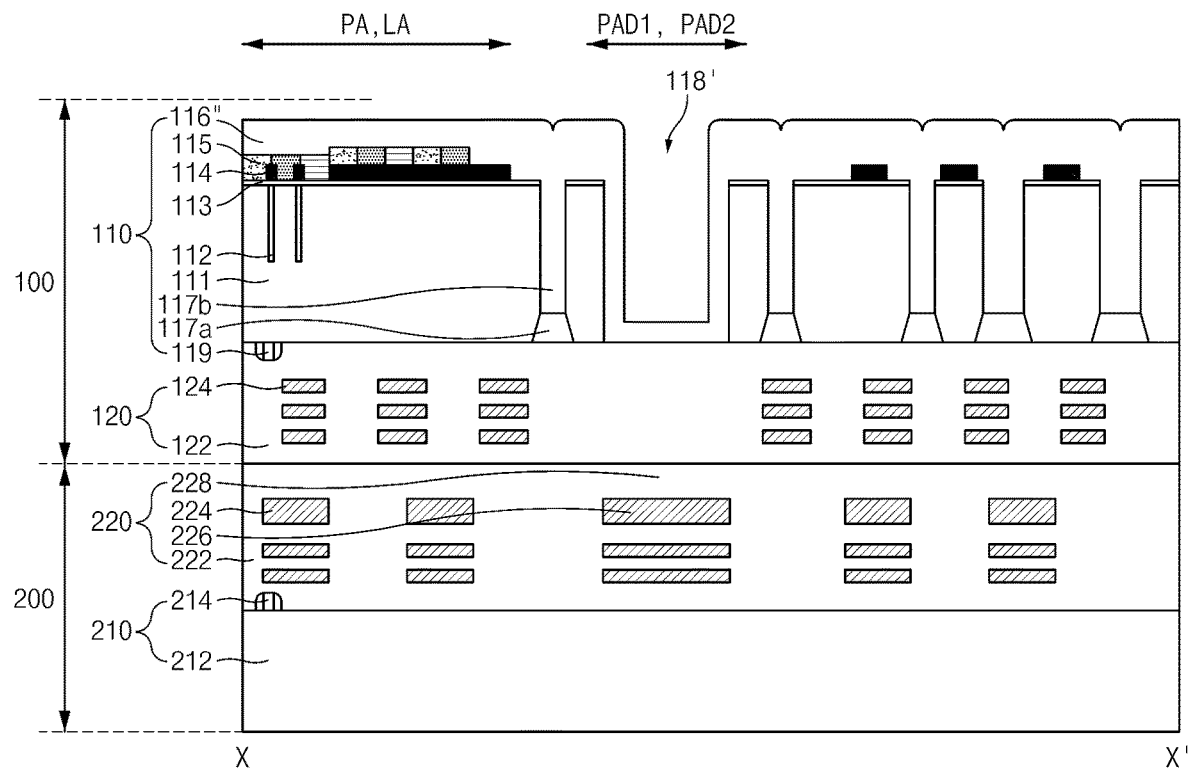

Referring to FIG. 10, a lens material may be formed over the lens material layer 116' to fill the trenches 117b', thereby forming a lens material layer 116".

Here, the first pad hole 118' is formed to have a larger width than each of the trenches 117'. In the first pad hole 118', the lens material may be formed only on the sidewall and the bottom surface of the first pad hole 118'. The lens material layers 116' and 116" may include the same material (e.g., a light transmissive photoresist).

The lens material layer 116" formed in the cell region (PA) may be used as the over-coating layer that can be used to remove uneven surfaces of the color filters 115.

Figure 11:
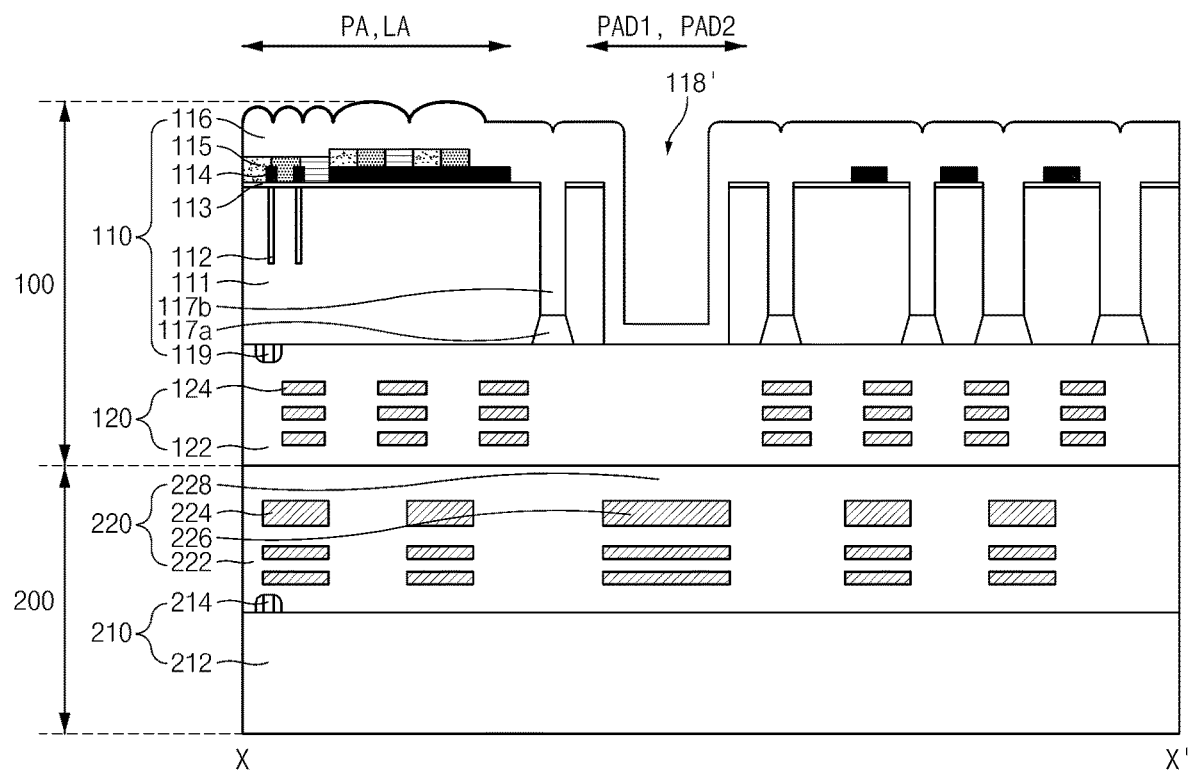

Referring to FIG. 11, microlenses, each of which is formed in a convex hemispherical shape having a predetermined radius of curvature (RoC), may be formed over the lens material layer 116" in the pixel region (PA), resulting in formation of the lens layer 116.

A lens capping layer may be formed over the lens layer 116 to protect the lens layer 116 and to prevent flare characteristics occurring in the lens layer 116.

Figure 12:
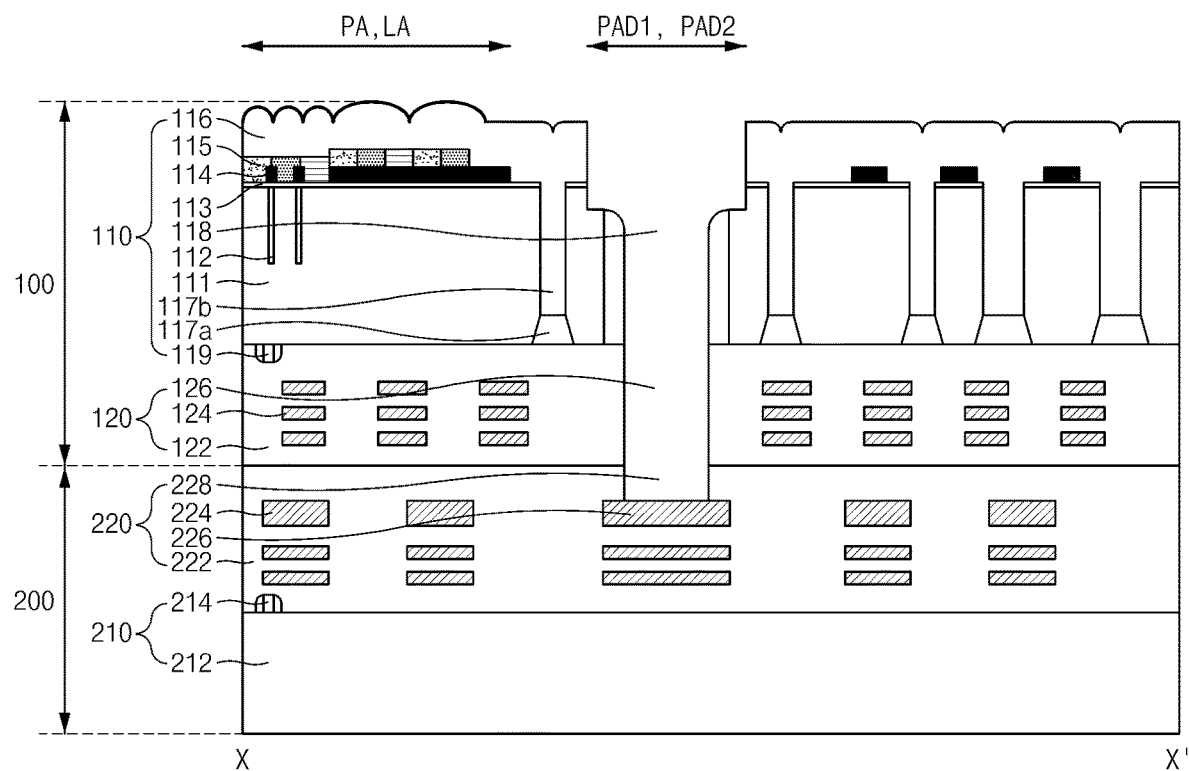

Referring to FIG. 12, after the lens material on the bottom surface of the first pad hole 118' is removed, an etching process for opening the pad may be performed.

For example, the first interlayer insulation layer 122 and the second interlayer insulation layer 222 may be etched until the electrode pad 226 is exposed using the lens material formed on the sidewall of the first pad hole 118' as an etching barrier, so that the first pad hole 118, the second pad hole 126, and the pad trench 228, each of which exposes the electrode pad 226, can be formed.

In this case, the upper region of the first pad hole 118 is also partially etched, so that the upper region of the first pad hole 118 may be formed to have a larger width than the lower region of the first pad hole 118.

Figure 13:
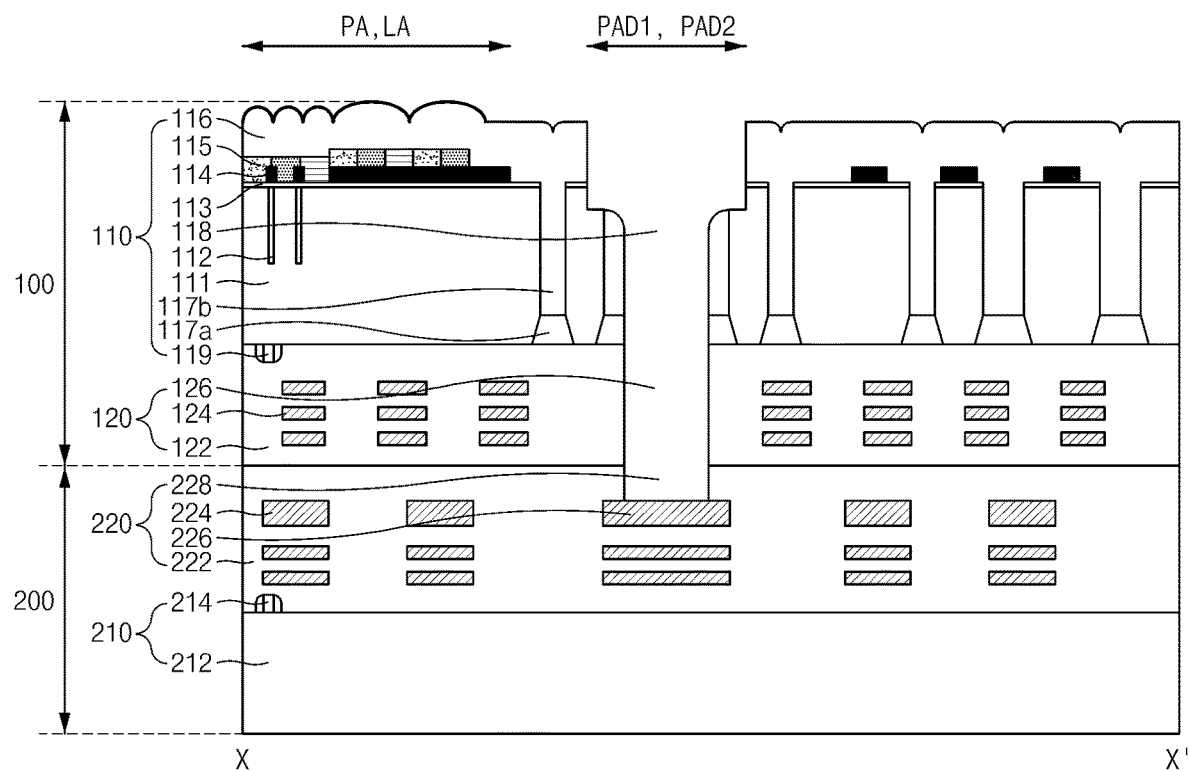
FIG. 13 is a cross-sectional view illustrating an example structure of an image sensing device based on some other implementations of the disclosed technology.
Figure 14:
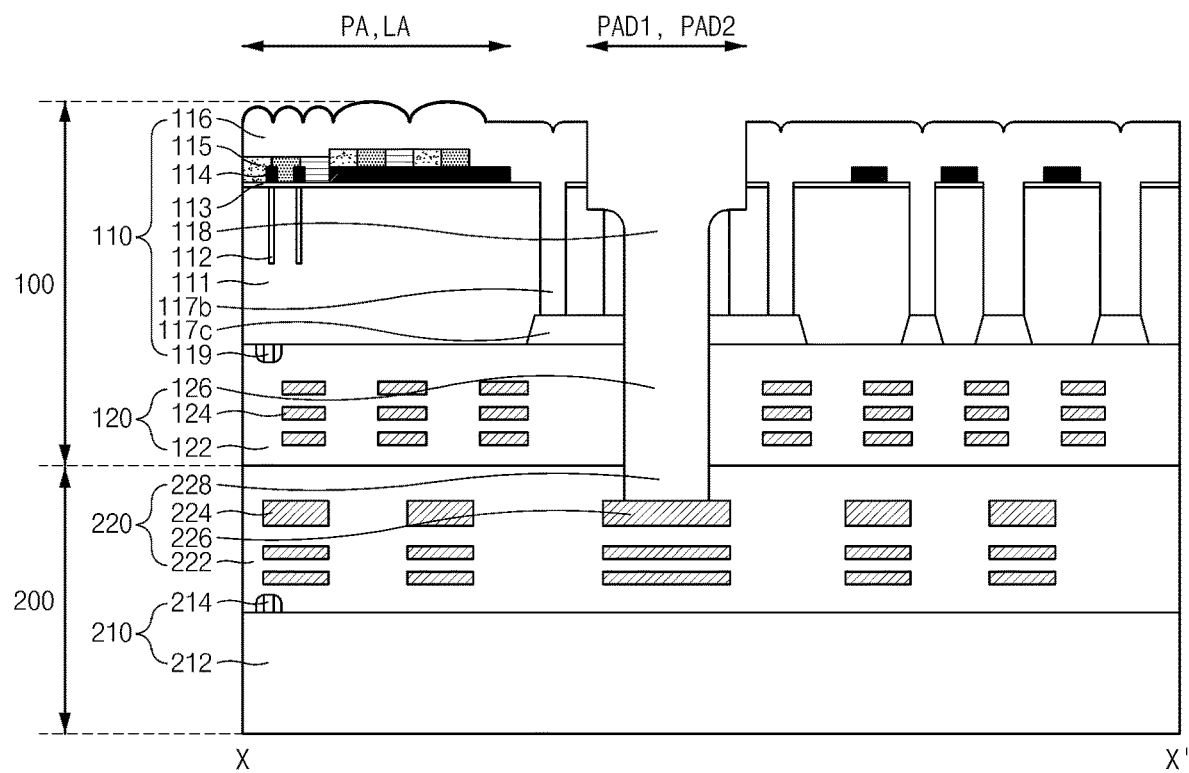
FIG. 14 is a cross-sectional view illustrating an example structure of an image sensing device based on some other implementations of the disclosed technology.

FIGS. 13 and 14 are cross-sectional views schematically illustrating example structures of an image sensing device based on some other implementations of the disclosed technology.

Referring to FIG. 13, the first substrate separation layer 117a may also be formed in the pad region (PAD1) of the first substrate 111.

As described above, the first substrate isolation layer 117a is also formed in the pad region (PAD1). Thus, when the substrate isolation trenches 117b' and the pad hole 118' are simultaneously formed as shown in FIG. 9, the substrate isolation trenches 117b' and the pad hole 118' may be formed to have the same depth.

Referring to FIG. 14, the first substrate isolation layer 117c of the pad region (PAD1) may be formed as a single first substrate isolation layer 117c in which adjacent first substrate isolation layers are connected to each other.

As described above, since the first substrate isolation layer located in the pad region (PAD1) and the first substrate isolation layers adjacent to the first substrate isolation layer are formed as one large first substrate isolation layer 117c, the first substrate isolation layers can be easily designed.

As is apparent from the above description, the image sensing device based on some implementations of the disclosed technology can increase production efficiency by reducing the number of masks and the number of fabrication processes that are required to form the trench isolation structure and the direct pad.

The embodiments of the disclosed technology may provide a variety of effects capable of being directly or indirectly recognized through the above-mentioned patent document.

Although a number of illustrative embodiments have been described, it should be understood that various modifications or enhancements of the disclosed embodiments and other embodiments can be devised based on what is described and/or illustrated in this patent document.

What is claimed is:

1. A method for manufacturing an image sensing device comprising:
   bonding a first stacked structure including a first substrate and a first insulation layer to a second stacked structure including a second substrate and a second insulation layer such that the first insulation layer and the second insulation layer are in contact with each other;
   forming a pad hole in a pad region predefined and a substrate isolation layer trench in a peripheral region of the pad region by etching the first substrate;
   forming a lens material layer over the first substrate such that a lens material is formed at a sidewall of the pad hole while filling the substrate isolation layer trench; and
   exposing an electrode pad disposed in the second insulation layer by etching the first insulation layer and the second insulation layer using the lens material layer formed at the sidewall of the pad hole as an etching mask.

2. The method according to claim 1, further comprising:
   before forming the pad hole and the substrate isolation layer trench,
   forming a first lens material layer over a first surface of the first substrate.

3. The method according to claim 2, wherein the forming the lens material layer includes:
   additionally forming a second lens material layer over the first lens material layer.

4. The method according to claim 3, further comprising:
   before forming the second lens material layer and exposing the electrode pad,
   forming microlenses over the second lens material layer.

5. The method according to claim 1, further comprising:
   before bonding the first stacked structure to the second stacked structure, forming, in the first substrate, a first substrate isolation layer including an insulation material formed to a predetermined depth from a second surface of the first substrate.

6. The method according to claim 5, wherein:

the first substrate isolation layer is formed at a position where the first substrate isolation layer vertically overlaps the substrate isolation layer trench, and is not formed at a position where the first substrate isolation layer vertically overlaps the pad hole.

7. The method according to claim 6, wherein:

the pad hole is formed to expose the first insulation layer; and the substrate isolation layer trench is formed to expose the first substrate isolation layer.

8. The method according to claim 5, wherein:

the first substrate isolation layer is formed at a position where the first substrate isolation layer vertically overlaps the pad hole and the substrate isolation layer trench.

9. The method according to claim 8, wherein:

the pad hole and the substrate isolation layer trench are formed to expose the first substrate isolation layer.

10. The method according to claim 1, further comprising:

before bonding the first stacked structure to the second stacked structure and forming the pad hole and the substrate isolation layer trench, forming a pixel isolation layer for isolating each of photoelectric conversion regions of unit pixels in the first substrate.

\* \* \* \* \*